(12) United States Patent
Kim

(10) Patent No.: US 7,186,641 B2
(45) Date of Patent: Mar. 6, 2007

(54) METHODS OF FORMING METAL INTERCONNECTION LINES IN SEMICONDUCTOR DEVICES

(75) Inventor: Seung Hyun Kim, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 74 days.

(21) Appl. No.: 11/009,470

(22) Filed: Dec. 10, 2004

(65) Prior Publication Data

US 2005/0130401 A1 Jun. 16, 2005

(30) Foreign Application Priority Data

Dec. 11, 2003 (KR) .................... 10-2003-0090326

(51) Int. Cl.
*H01L 21/4763* (2006.01)

(52) U.S. Cl. ..................... 438/622; 438/623

(58) Field of Classification Search ........ 438/622–623, 438/624, 600; 257/791
See application file for complete search history.

(56) References Cited

U.S. PATENT DOCUMENTS 6,444,565 B1 * 9/2002 Feild et al. ................. 438/622

FOREIGN PATENT DOCUMENTS

KR 1019990060819 7/1999
KR 1020010065145 11/2001

* cited by examiner

*Primary Examiner*—Theresa T. Doan
(74) *Attorney, Agent, or Firm*—Andrew D. Fortney

(57) ABSTRACT

A method of forming metal interconnection line for a semiconductor device being capable of forming a plug without voids irrespective of aspect ratios is provided. In one example, the method includes forming a first metal layer on a semiconductor substrate; forming a second metal layer on the first metal layer; forming the plugs by patterning the second metal layer; forming the lower metal interconnection lines by patterning the first metal layer; and forming an interlayer insulating layer having a planarized surface on the substrate to fill gaps between the lower metal lines and between the plugs.

6 Claims, 2 Drawing Sheets

METHODS OF FORMING METAL INTERCONNECTION LINES IN SEMICONDUCTOR DEVICES

TECHNICAL FIELD

The present disclosure relates to semiconductor devices and, more particularly, to methods of forming metal interconnection lines in semiconductor devices.

BACKGROUND

As semiconductor devices become more highly integrated, a design rule is reduced, and metal interconnection lines are multi-layered and miniaturized. In addition, as the associated metal interconnection line patterns are miniaturized, an aspect ratio of a contact or via hole increases. Therefore, it is difficult to completely fill the contact or via holes with tungsten (W).

In a conventional method, after forming a contact or via hole by etching an insulating layer, a barrier metal layer and plug are formed within the contact or via hole. However, as a result of the etching process, the size of the contact or via hole may be widened and the slopes thereof may be lowered. In addition, the aspect ratio thereof may increase. In this case, in a subsequent process for depositing a plug material, voids may occur within the plugs.

If there are voids in the plugs, metal interconnection line resistance increases. There is a problem in that operating speed of a semiconductor device may be lowered due to increase of RC delay due to the increased line resistance.

DETAILED DESCRIPTION

Figure 1A:
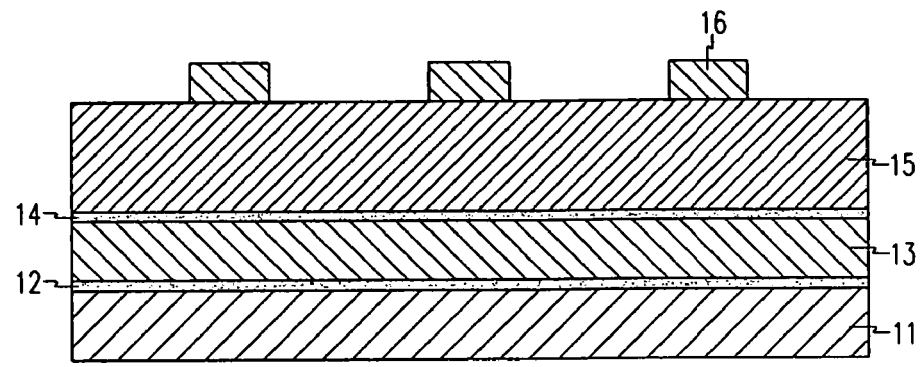
FIGS. 1A to 1F are cross sectional views for explaining methods of forming a metal interconnection line for a semiconductor device.

Referring to FIG. 1A, a first metal layer 13 for a lower metal interconnection line is deposited on a semiconductor substrate 11 where a lower structure (not shown) is formed. A second metal layer 15 for a plug is deposited on the first metal layer 13. In one example, the first metal layer 13 is made of aluminum, aluminum alloy, copper, tungsten, or metal silicide etc. First and second barrier metal layers 12 and 14, which may be made of Ti, TiTi/TiN, Ta, or Ta/TaN etc. may be formed on upper and lower portions of the first metal layer 13, respectively. According to one example, the second metal layer 15 is made of aluminum, aluminum alloy, copper, tungsten or metal silicide etc. Next, first mask pattern 16 is formed on the second metal layer 15 by a photolithography process.

Figure 1B:
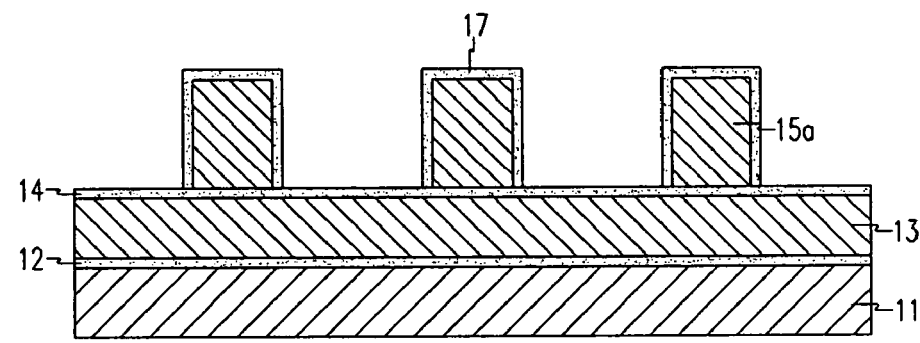

Referring to FIG. 1B, plugs 15a are formed by etching the second metal layer 15 using the first mask pattern 16 (see FIG. 1A) as an etching mask with an etching process. Subsequently, the first mask pattern 16 is removed by a well-known method. Next, a Ti/TiN glue layer 17 is formed on surfaces of the plugs 15a. Here, the glue layer 17 is formed to improve adhesion of the plugs 15a to an interlayer insulating layer that is formed in a subsequent step. In one example, the glue layer 17 is made of Ti, Ti/TiN, Ta, or Ta/TaN etc. and formed by a sputtering method or a chemical vapor deposition (CVD) method.

Figure 1C:
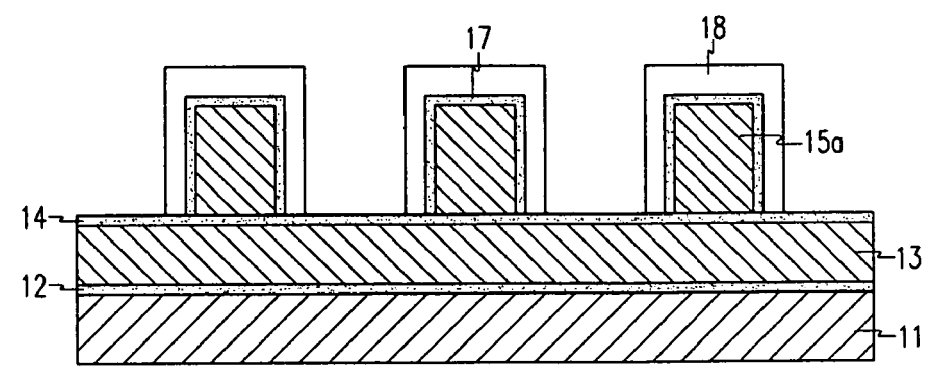

Referring to FIG. 1C, second mask pattern 18 is formed to cover the plugs 15a where the glue layer 17 is formed by a photolithography process. Here, the width of second mask pattern 18 is wider than that of the plug 15a.

Figure 1D:
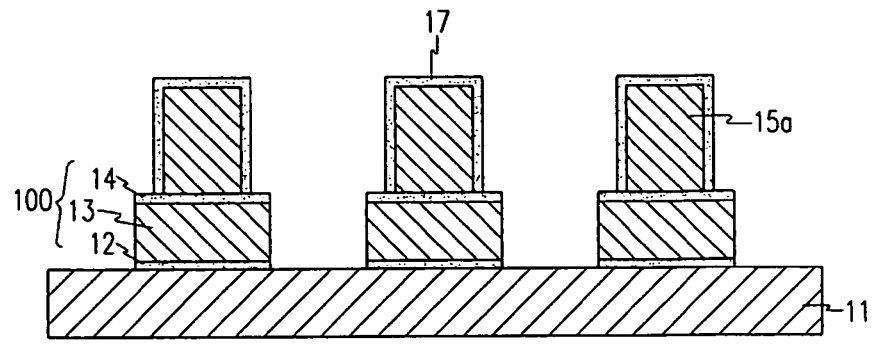

Referring to FIG. 1D, lower metal interconnection lines 100 are formed by etching the second barrier metal layer 14, the first metal layer 13, and the first barrier layer 12 by using the first mask pattern 18 (see FIG. 1C), the glue layer 17, and the plugs 15a as etching masks with an etching process. Subsequently, the mask pattern 18 is removed by a well-known method.

Figure 1E:
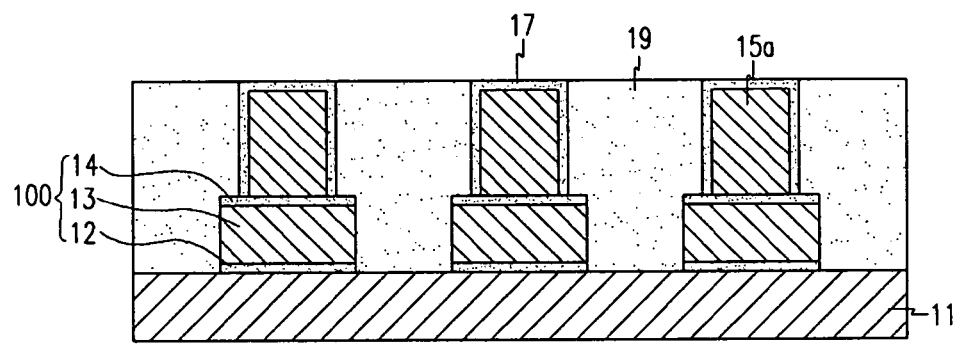

Referring to FIG. 1E, an interlayer insulating layer 19 is formed on the entire surface of the substrate 11 to fill gaps between the lower metal interconnection lines 100 and between the plugs 15a. Next, the interlayer insulating layer 19 is planarized by a chemical mechanical polishing (CMP) process or an etch-back process to expose the surface of the glue layer 17.

Figure 1F:
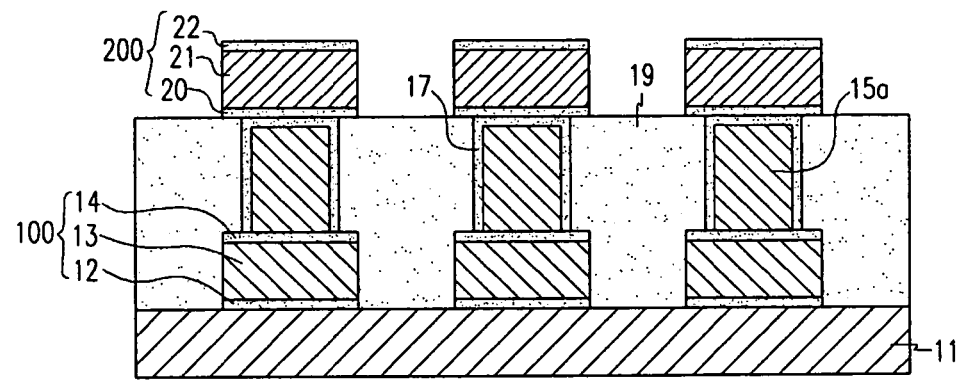

Referring to FIG. 1F, a third metal layer 21 for upper metal line is deposited. The third metal layer 21 is made of aluminum, aluminum alloy, copper, tungsten, or metal silicide etc. Third and fourth barrier metal layers 20 and 22 may be formed on the upper and lower portions of the third metal layer 21. Next, the fourth barrier metal layer 22, the third metal layer 20, and the third barrier metal layer 21 are patterned by a photolithography process and an etching process, so that upper metal interconnection lines 200 are formed so as to be electrically connected to the lower metal interconnection lines 100 through the plugs 15a.

As described above, in the prior art, plugs are formed by forming contact or via hole, depositing a metal layer made of W or the like in the hole, and performing planarization. However, as disclosed herein, the plugs can be formed by not forming the contact or via holes, but by depositing the metal layer and performing the planarization. Therefore, it is possible to easily form the plugs without voids irrespective of aspect ratios of the holes.

In addition, as disclosed herein, because a CMP process need not be performed on a plug metal layer, it is possible to prevent residues from occurring on the plug metal layer. Furthermore, because etching processes for forming the contact or via hole can be omitted, it is possible to prevent damage of lower metal interconnection line due to the etching. As a result, the disclosed process simplifies manufacturing processes and improves reliability of the metal interconnection line of the semiconductor device.

As disclosed herein, a method of forming a metal interconnection line for a semiconductor device comprises forming a first metal layer on a semiconductor substrate; forming a second metal layer on the first metal layer; forming plugs by patterning the second metal layer; forming lower metal interconnection lines by patterning the first metal layer; and forming an interlayer insulating layer having a planarized surface on the substrate to fill gaps between the lower metal lines and between the plugs.

According to one example, forming the lower metal lines may comprise forming a mask pattern having larger width than that of the plug on the first metal layer to cover the plugs; etching the first metal layer using the mask pattern and plugs; and removing the mask pattern. Additionally, barrier metal layers Ti/TiN layers may be formed on upper and lower portions of the first metal layer. Further, barrier metal layers of Ti/TiN layers may be formed on upper and lower portions of the third metal layer.

In one example, the second metal layer may be aluminum, aluminum alloy, copper, tungsten, or metal silicide layer. In this case, between forming the plugs and forming the lower metal interconnection lines, a glue layer may be formed to cover surfaces of the plugs.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming a metal interconnection line for a semiconductor device, the method comprising:

forming a first metal layer on a semiconductor substrate;

forming a second metal layer comprising aluminum, aluminum alloy, copper, tungsten, or a metal silicide layer on the first metal layer.

forming plugs by patterning the second metal layer;

forming a glue layer comprising Ti, Ti/TiN, Ta, or Ta/TaN to cover surfaces of the plugs;

forming lower metal interconnection lines by patterning the first metal layer, wherein forming the lower metal interconnection lines comprises:

forming a mask pattern having larger width than that of the plug on the first metal layer to cover the plugs;

etching the first metal layer using the mask pattern and plugs; and removing the mask pattern; and forming an interlayer insulating layer having a planarized surface on the substrate to fill gaps between the lower metal lines and between the plugs.

2. The method as defined by claim 1, further comprising forming barrier metal layers on upper and lower portions of the first metal layer.

3. The method as defined by claim 2, wherein the barrier metal layers comprise Ti, Ti/TiN, Ta, or Ta/TaN layers.

4. The method as defined by claim 1, further comprising:

forming a third metal layer on the entire substrate; and forming upper metal interconnection lines to be connected to the lower metal interconnection lines via plugs by patterning the third metal layer.

5. The method as defined by claim 4, further comprising forming barrier metal layers on upper and lower portions of the third metal layer.

6. The method as defined by claim 5, wherein the barrier metal layers comprise Ti, Ti/TiN, Ta, or Ta/TaN layers.

* * * * *